(12) United States Patent
Kondo et al.

(10) Patent No.: US 11,424,106 B2
(45) Date of Patent: Aug. 23, 2022

(54) PLASMA PROCESSING APPARATUS

(71) Applicant: HITACHI HIGH-TECH CORPORATION, Tokyo (JP)

(72) Inventors: Yuki Kondo, Tokyo (JP); Kenetsu Yokogawa, Tokyo (JP); Masahito Mori, Tokyo (JP); Satoshi Une, Tokyo (JP); Kazunori Nakamoto, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 530 days.

(21) Appl. No.: 16/463,531

(22) PCT Filed: May 28, 2018

(86) PCT No.: PCT/JP2018/020271
§ 371 (c)(1),
(2) Date: May 23, 2019

(87) PCT Pub. No.: WO2019/229784
PCT Pub. Date: Dec. 5, 2019

(65) Prior Publication Data
US 2021/0111002 A1 Apr. 15, 2021

(51) Int. Cl.
*H01J 37/32* (2006.01)
*H01L 21/3065* (2006.01)
*H05H 1/46* (2006.01)

(52) U.S. Cl.
CPC .. *H01J 37/32238* (2013.01); *H01J 37/32201* (2013.01); *H01J 37/32311* (2013.01);
(Continued)

(58) Field of Classification Search
CPC ............ H01J 2237/334; H01J 37/32; H01J 37/32201; H01J 37/32238;
(Continued)

(56) References Cited

U.S. PATENT DOCUMENTS 5,665,167 A    9/1997  Deguchi et al.
6,878,233 B2 * 4/2005  Hirose ............... H01L 21/6833
                                                    156/345.28
(Continued)

FOREIGN PATENT DOCUMENTS

JP   S62-148570 U   9/1987
JP   H06-244147 A   9/1994
(Continued)

*Primary Examiner* — Lan Vinh
(74) *Attorney, Agent, or Firm* — Miles & Stockbridge, P.C.

(57) ABSTRACT

Provided is a technique capable of reducing a variation in processing in an in-plane direction of a sample and improving a yield of processing. A plasma processing apparatus 1 includes a first electrode (a base material 110B) disposed in a sample stage 110, a ring-shaped second electrode (a conductive ring 114) disposed surrounding an outer peripheral side of an upper surface portion 310 (a dielectric film portion 110A) of the sample stage 110, a dielectric ring-shaped member (a susceptor ring 113) that covers the second electrode and is disposed surrounding an outer periphery of the upper surface portion 310, a plurality of power supply paths that supply high frequency power from a high frequency power supply to the first electrode and the second electrode respectively, and a matching device 117 disposed on a power supply path to the second electrode. Further, a first position (A1) and a grounding position between the second electrode and the matching device 117 on the power supply path to the second electrode are electrically connected via a resistor 118 having a predetermined value.

5 Claims, 3 Drawing Sheets

(52) U.S. Cl.
CPC .. *H01J 37/32541* (2013.01); *H01J 37/32577* (2013.01); *H01L 21/3065* (2013.01); *H05H 1/46* (2013.01); *H01J 2237/334* (2013.01)

(58) Field of Classification Search
CPC ........... H01J 37/32311; H01J 37/32541; H01J 37/32577; H01J 37/32183; H01J 37/32715; H01L 21/3065; H01L 21/67; H01L 21/67069; H05H 1/46
USPC ............. 156/345.44, 345.47, 345.48, 345.58
See application file for complete search history.

(56) References Cited

U.S. PATENT DOCUMENTS

| | | | |
|---|---|---|---|
| 2009/0071938 A1 | 3/2009 | Dhindsa et al. | |
| 2013/0003250 A1* | 1/2013 | Morimoto | H01L 21/6831 361/234 |
| 2016/0351404 A1 | 12/2016 | Aramaki et al. | |
| 2017/0032936 A1* | 2/2017 | Koshiishi | H01J 37/32082 |
| 2017/0103871 A1* | 4/2017 | An | G01R 29/02 |

FOREIGN PATENT DOCUMENTS

| | | | |
|---|---|---|---|
| JP | 2010532099 A | 9/2010 |
| JP | 2016031955 A | 3/2016 |
| JP | 2016225376 A | 12/2016 |

* cited by examiner

[FIG. 1]
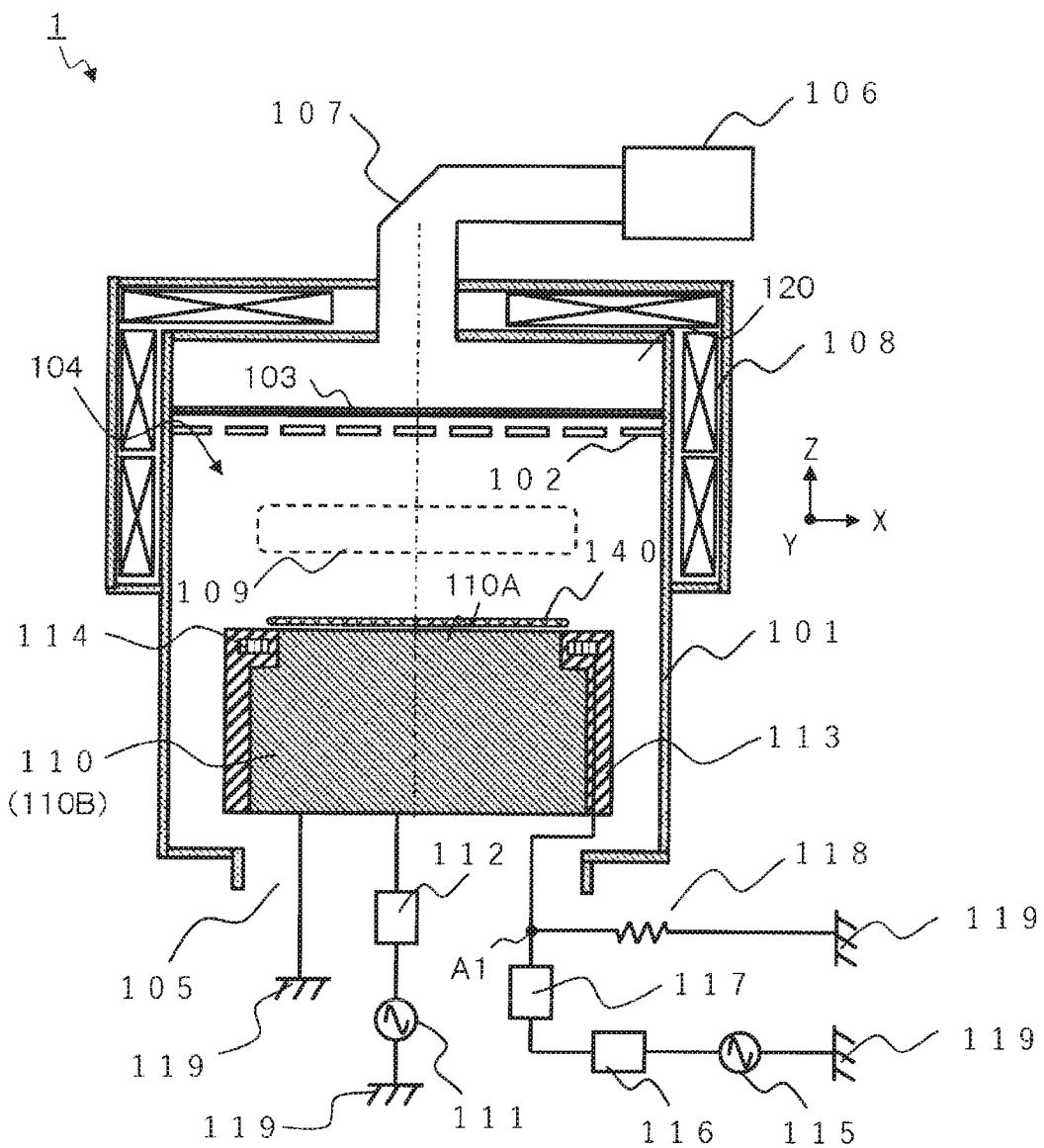

[FIG. 2]
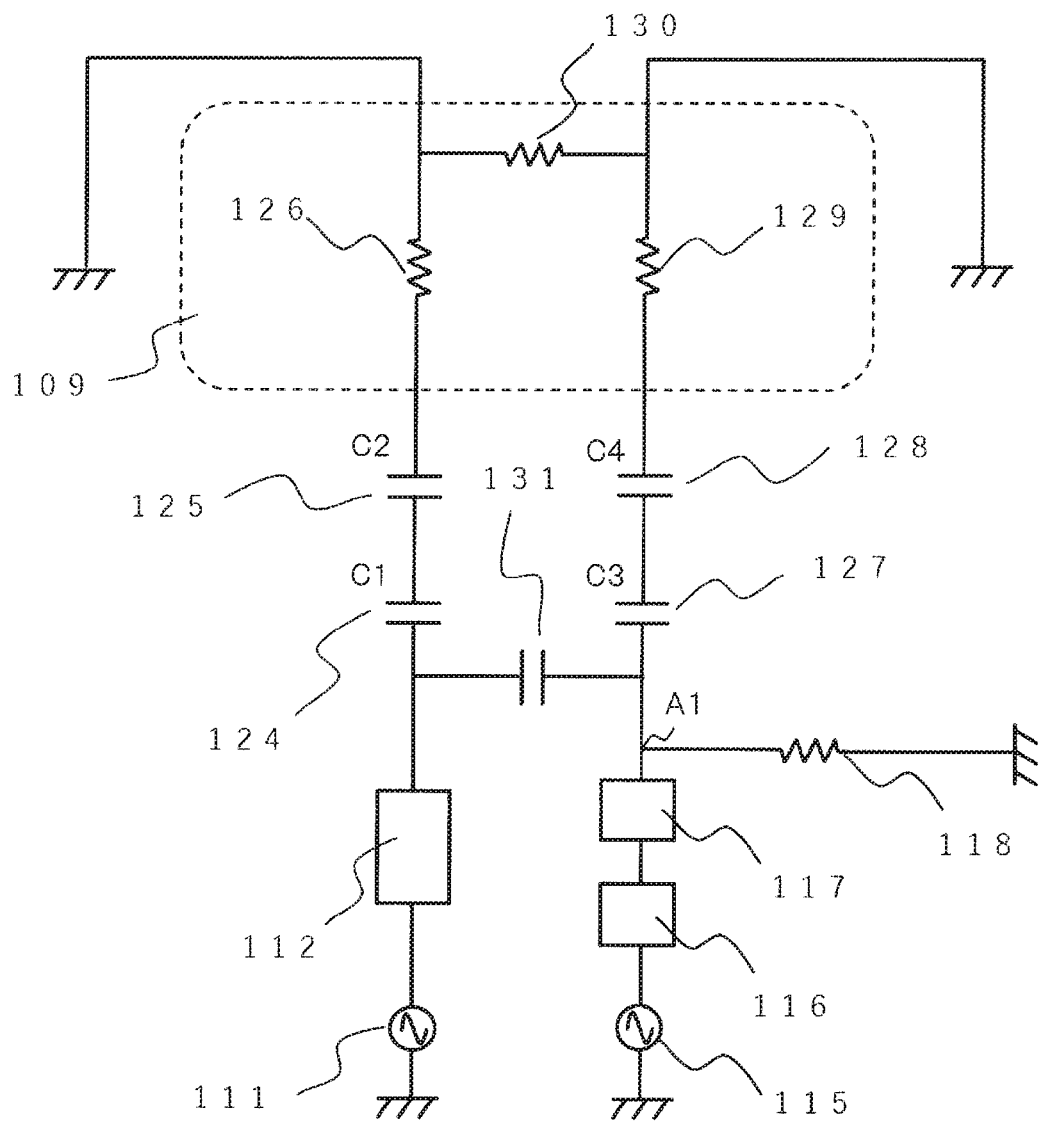

[FIG. 3]
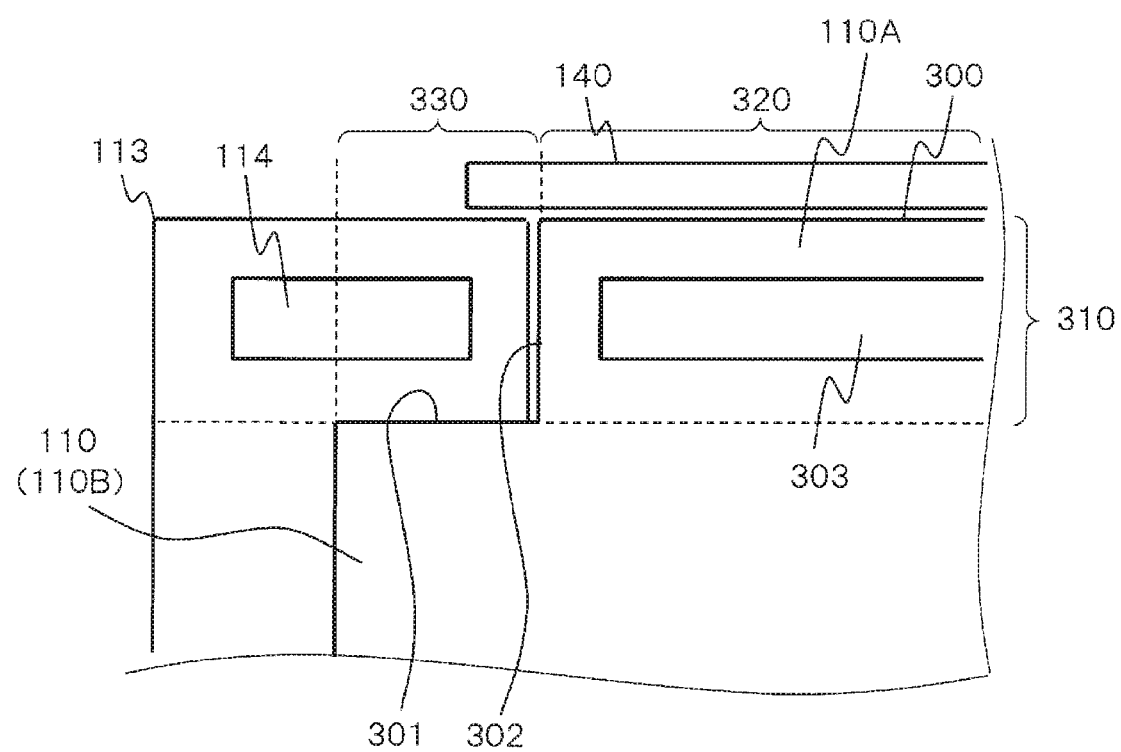

PLASMA PROCESSING APPARATUS

TECHNICAL FIELD

The present invention relates to a technique of a plasma processing apparatus. The invention further relates to a technique of supplying high frequency power to the sample stage to process a substrate-shaped sample such as a semiconductor wafer to be processed which is placed on a sample stage installed in a processing chamber in a vacuum container when the sample is processed using plasma.

BACKGROUND ART

In a step of manufacturing a semiconductor device, processing of forming a circuit structure by etching a film structure formed by laminating a plurality of films that includes a mask layer previously formed on an upper surface of a sample such as a semiconductor wafer and a film layer to be processed based on the mask layer has been widely performed. Generally, such etching processing employs a plasma processing apparatus that processes a sample disposed in a processing chamber in a vacuum container using plasma formed in the processing chamber.

Particularly, a high frequency bias technique is used in many currently used plasma processing apparatus. This technique attracts a charged particle such as an ion in plasma formed by exciting, ionizing and diverging gas that is used for processing and is introduced into a processing chamber to a sample surface by a bias potential generated by high frequency power formed on an upper surface of a sample. Accordingly, highly anisotropic etching is performed.

In a related art, such a plasma processing apparatus is required to process a sample surface more uniformly in an in-plane direction in order to improve productivity or yield of a semiconductor device. For example, on an upper surface of a wafer having a circular shape or an approximate circular shape approximate to an extent that can be regarded as a circular shape, a speed of performing etching processing on a film layer to be processed may be different between a center side region and an outer peripheral side region. In that case, a difference between a shape of a film layer in the central side region and a shape of a film layer in the outer peripheral side region obtained after processing may increase. In addition, a difference in performance of a circuit obtained from the step of etching processing increases, and performance of one side may be out of an allowable range. Accordingly, there is a problem that a yield of manufacturing the semiconductor device is impaired.

Such a general problem has been considered, for example, as follows. That is, it is considered that a speed difference of processing on an upper surface of the wafer in the in-plane direction causes a bias of distribution of a plasma potential or a charged particle in an outer peripheral side portion of the wafer. In addition, it has been considered that a value or a distribution of an intensity of an electric field is more uniformly brought close to the entire upper surface of the wafer.

Japanese Patent Application No. 2016-31955 (PLT 1) is regarded as a prior art example related to the plasma processing apparatus described above. The following effect is disclosed in PLT 1 as a plasma processing apparatus or the like. The plasma processing apparatus includes a ring-shaped member having conductivity and a dielectric ring cover that covers an upper portion of the member in a ring-shaped concave portion disposed around an outer periphery of a placement surface of a wafer which is configured by an upper surface of an upper portion of a sample stage disposed in a processing chamber. The plasma processing apparatus supplies high frequency power to the ring-shaped member having conductivity during wafer processing, and particularly supplies another high frequency power that is independently adjusted to a frequency or a power value different from high frequency power used to form a bias potential supplied to a metal base material which is an electrode disposed inside the sample stage to the ring-shaped member having conductivity. Accordingly, an intensity distribution of an electric field due to high frequency power or a value of a bias potential formed above an upper surface of a wafer being processed is desirably controlled to be in an in-plane direction of the wafer. Accordingly, a variation in a shape of a processed film structure obtained from a result of the processing in the in-plane direction is reduced, and a yield of processing is improved.

PRIOR ART LITERATURE

Patent Literature

PTL 1: JP-A-2016-31955

SUMMARY OF INVENTION

Technical Problem

The plasma processing apparatus in the related art example, however, has a problem since the following points have not been considered sufficiently.

That is, the plasma processing apparatus is regarded to include a first circuit that supplies high frequency power to a base material on which a wafer is placed and a second circuit (including, for example, a matching device) that supplies high frequency power to a ring-shaped member. In that case, the first circuit and the second circuit are electrically coupled in plasma and a part of the power may leak from the first circuit to the second circuit. Therefore, it is difficult to control an electric field in a vicinity of an outer peripheral edge of a wafer by a ring-shaped member since the matching device in the second circuit is unstable due to conditions of the plasma and the two kinds of high frequency power.

Further, since impedance of a dielectric ring cover that covers a conductive member is very large in the configuration of the plasma processing apparatus, it has been found that high frequency power cannot be efficiently supplied as it is. Further, a voltage is generated in the dielectric ring cover due to power leaking from the first circuit and there is a concern that etching performance in the vicinity of the outer peripheral edge of the wafer may be changed.

With regard to a plasma processing apparatus, an object of the invention is to provide a technique capable of preventing inhomogeneity of an electric field in a vicinity of an outer peripheral edge of a sample, reducing a variation in processing in an in-plane direction of the sample, and improving a yield of processing in correspondence with various plasma conditions.

Solution to Problem

A representative embodiment of the invention is a plasma processing apparatus and has a configuration illustrated as follows. A plasma processing apparatus according to one embodiment processes a sample placed above an upper surface of a sample stage disposed in a processing chamber in a vacuum container using plasma generated in the sample chamber. The plasma processing apparatus includes a base material member including a convex portion on which the sample is placed, and having a first electrode disposed in the sample there-inside, a ring-shaped second electrode disposed in a ring-shaped concave portion to surround the concave portion of the base material member on an outer peripheral side of the upper surface of the sample stage, a dielectric ring-shaped member disposed in the concave portion to cover the second electrode and to surround an outer periphery of the concave portion of the base material member, a plurality of power supply paths that supply high frequency power from a high frequency power supply to the first electrode and the second electrode respectively, and a matching device disposed on a power supply path from the high frequency power supply to the second electrode out of the plurality of power supply paths and an impedance adjustable circuit disposed on the power supply path between the matching device and the second electrode. A first position and a grounding position on the power supply path between the impedance adjustable circuit and the second electrode are electrically connected via only a resistive element having a predetermined value, and the ring-shaped second electrode is disposed inside the dielectric ring-shaped member.

Advantageous Effect

According to the representative embodiment of the invention, the plasma processing apparatus can prevent inhomogeneity of an electric field in a vicinity of an outer peripheral edge of a sample, reduce a variation in processing in an in-plane direction of the sample, and improve a yield of processing in correspondence with various plasma conditions.

BRIEF DESCRIPTION OF DRAWINGS

FIG. 1 is a longitudinal sectional view schematically showing a configuration of a plasma processing apparatus according to an embodiment of the invention.

FIG. 2 is a circuit diagram equivalently showing a path of high frequency bias power in the plasma processing apparatus according to the embodiment in FIG. 1.

FIG. 3 is an enlarged schematic view showing a part of a sample stage in the plasma processing apparatus in FIG. 1.

DESCRIPTION OF EMBODIMENTS

Hereinafter, a plasma processing apparatus according to an embodiment of the invention will be described with reference to FIGS. 1 to 3.

[Plasma Processing Apparatus (1)]

FIG. 1 is a longitudinal sectional view schematically showing a configuration of a plasma processing apparatus 1 according to an embodiment of the invention. An X direction, a Y direction, and a Z direction are used for explanation). The Z direction is a vertical direction and is a central axis direction of a shape of a cylinder or the like. The X direction and the Y direction are two directions that form a horizontal plane and a surface of a wafer and the like perpendicular to the Z direction and that correspond to a radial direction. FIG. 1 shows a cross section centering a central axis of a dashed-dotted line in the Z direction.

The plasma processing apparatus 1 of the present embodiment illustrates a configuration example related to a microwave ECR plasma etching device that performs plasma etching processing using Electron Cyclotron Resonance (ECR). In an ECR method, a microwave having a specific frequency is used as an electric field to form plasma in a processing chamber 104, and further a magnetic field having an intensity corresponding to a frequency of the electric field is supplied into the processing chamber 104. ECR is generated by an interaction between the electric field and the magnetic field. Further, in this method, an atom or a molecule of a gas supplied into the processing chamber 104 is excited by the ECR to form plasma, and a film structure to be processed on an upper surface of a wafer 140 is etched.

The plasma processing apparatus 1 according to the embodiment illustrated in FIG. 1 includes a vacuum container 101 that internally includes the processing chamber 104, a plasma forming unit, and an exhaust unit.

The processing chamber 104 has a cylindrical shape and is vacuum inside. The processing chamber 104 or the like has an axisymmetric shape such as a cylinder.

The plasma forming unit is disposed above the vacuum container 101 in the Z direction and surrounding the processing chamber 104 and provides an electric field and a magnetic field to form plasma. The plasma forming unit is particularly a method of forming ECR, and specifically is provided with a plurality of solenoid coils 108 and the like.

The plurality of cylindrical solenoid coils 108 that generate a magnetic field are disposed on an outer periphery of a cylindrical side wall of an upper portion of the vacuum container 101 and above a dielectric window 103 and a space portion 1020 to surround them. An electric field supplied to the processing chamber 104 causes an interaction (i.e., ECR) between magnetic fields generated by the solenoid coil 108 and excites a particle of a gas for processing supplied to the processing chamber 104 to generate plasma 109 in the processing chamber 104. Further, magnetic flux density required to generate ECR is 0.0875T with respect to a microwave of 2.45 GHz.

The exhaust unit includes a vacuum pump that is disposed below the vacuum container 101 in the Z direction and that exhausts a gas, a plasma particle, and the like in the processing chamber 104 to the outside.

The dielectric window 103 is disposed on an upper portion of the processing chamber 104. The dielectric window 103 has a disk shape, and a microwave supplied from above the Z direction permeates an inside and is supplied into the processing chamber 104. A seal member such as an O-ring (not shown) is provided between the processing chamber 104 and the dielectric window 103. Accordingly, the processing chamber 104 and an external atmosphere are air-tightly sealed.

A shower plate 102 is disposed below the dielectric window 103. The shower plate 102 is formed with a plurality of through holes to allow gas for processing to flow and to be introduced into the processing chamber 104. The shower plate 102 includes a ceiling surface of a main space of the processing chamber 104. A space having a predetermined thickness with small height, which is connected with a gas introducing pipeline (not shown) to fill gas therein, is formed between the dielectric window 103 and the shower plate 102.

Further, a vacuum exhaust port 105 is disposed on the bottom of the processing chamber 104 at a position substantially concentric with the bottom. Gas supplied by a vacuum exhaust unit such as a turbo molecular pump or a particle of plasma generated in the processing chamber 104 is discharged to the outside through the vacuum exhaust port 105.

A waveguide 107 inside which an electric field spreads is disposed above the dielectric window 103 to supply a microwave electric field for generating plasma to the processing chamber 104 via a space portion 120. More specifically, the waveguide 107 is formed by connecting a circular waveguide with a rectangular waveguide through a corner portion.

An electric field generating power supply 106 such as a magnetron is connected to an end portion (one end portion in the X direction as shown) of the waveguide 107. An electric field generated by the electric field generating power supply 106 spreads through the waveguide 107 and is introduced into the space portion 120 above the dielectric window 103. The cylindrical space portion 120 for resonance is disposed between the dielectric window 103 and the waveguide 107. The bottom surface of the space portion 120 corresponds to the dielectric window 103.

The dielectric window 103 is made of a material such as quartz to allow an electric field to permeate. A microwave electric field permeates the dielectric window 103 and is supplied into the processing chamber 104. Although a frequency of the electric field is not particularly limited, a microwave of 2.45 GHz is used in the present embodiment.

A sample stage 110 is disposed on a lower portion (for example, a space on a lower half in the Z direction in FIG. 1) of the processing chamber 104 at a position substantially concentric with the processing chamber 104. The sample stage 110 has a cylindrical shape or a disk shape, and the wafer 140 which is a sample is placed on an upper surface.

More specifically, the sample stage 110 includes a base material 110B (a first electrode), a dielectric film portion 110A on an upper portion of the base material 110B, and a ring-shaped member 113 disposed on an outer periphery of the base material 110B and the dielectric film portion 110A. The base material 110B is a metal (conductive) member (the first electrode) that has a cylindrical or disk shape and includes a main part of the sample stage 110.

FIG. 3 is an enlarged schematic view of a part of the sample stage 110 and the like in FIG. 1. FIG. 3 also shows an example of a film-shaped electrode 303 (an electrostatic attracting electrode) disposed inside the dielectric film portion 110A.

An upper surface (a placement surface 300) of the sample stage 110 on which the wafer 140 is placed has a circular shape or a shape approximate to an extent that can be regarded as a circular shape which is the same as the wafer 140. An upper surface portion 310 including the upper surface is formed as the dielectric film portion 110A by coating an upper surface of the base material 110B with a dielectric film made of ceramics such as alumina or yttria by thermal spraying.

The film-shaped electrode 303 is built in the dielectric film portion 110A of the upper surface portion 310. The film-shaped electrode 303 is an electrostatic attracting electrode to electrostatically attract the wafer 140.

The base material 110B inside the sample stage 110 or the film-shaped electrode in the dielectric film portion 110A is electrically connected with a high frequency power supply 111 (a first high frequency power supply) disposed outside the processing chamber 104 via a matching device 112 (a first matching device) through a power supply cable and the like.

In the plasma processing apparatus 1, during the wafer 140 being processed, high frequency power is supplied from the high frequency power supply 111 to the base material 110B of the sample stage 110 or the film-shaped electrode 303 via the matching device 112. During the wafer 140 being processed, plasma 109 (generally shown by a broken line frame region) is formed in a space for forming plasma inside the processing chamber 104 above an upper surface of the sample stage 110. Accordingly, a bias potential is formed on the wafer 140 in accordance with a potential difference between the high frequency power (the first high frequency power) and a potential of the plasma 109 formed in the space. A charged particle such as an ion in the plasma 109 is attracted towards to the upper surface of the wafer 140 in accordance with the potential difference between the bias potential and the potential of the plasma 109. Further, the attracted charged particle collides with a film structure pre-formed on the upper surface of the wafer 140, and a film layer to be processed in the film structure is etched.

Further, as shown in FIG. 3, an upper portion of the sample stage 110 (the base material 110B and the dielectric film portion 110A) has a convex portion 320 with a central portion higher than an outer peripheral portion in the X direction and the Y direction. An upper surface of the convex portion 310 includes the placement surface 300 of the wafer 140. The upper surface of the convex portion 320 has an approximately circular shape in accordance with the shape of the wafer 140.

Further, on an upper portion of the sample stage 110, a concave portion 330 that has a lower height in the Z direction and surrounds an outer periphery of the convex portion 320 is formed at a portion on an outer peripheral side of the convex portion 320. The concave portion 330 is, in other words, a ring-shaped space. An upper surface 301 (an upper surface of a side wall portion extending from the convex portion 320 to an outer periphery) of the concave portion 330 and an upper portion of an outer peripheral side surface 302 of the convex portion 320 are covered with a coating film. The coating film is made of the same ceramic material as the dielectric film portion 110A.

Further, a susceptor ring 113 (an upper portion thereof and a portion extending to an inner peripheral side) is placed on the coating film of the upper surface 301 of the concave portion 330. The susceptor ring 113 is a dielectric ring-shaped member made of a material such as quartz. The susceptor ring 113 surrounds an outer peripheral side of the convex portion 320 of the upper surface portion 310 of the sample stage 110, and further also surrounds an outer peripheral side of the base member 110B. The sample stage 110 has a cylindrical or disk shape as a shape including the susceptor ring 113.

In a state where the susceptor ring 113 is placed on the concave portion 330 of the outer peripheral side of the convex portion 320, an upper surface made of quartz of the susceptor ring 113 faces the plasma 109 so as to be opposite to the shower plate 102 including a ceiling surface of the processing chamber 104 in the Z direction. A ring inner peripheral wall surface made of quartz of the susceptor ring 113 is opposite to an outer peripheral side wall surface (a side surface 302) of the convex portion 320 via a predetermined gap and surrounds the outer peripheral side wall surface of the convex portion 320. Further, an upper surface of the susceptor ring 113 surrounds the outer periphery of the placement surface 300 that is an upper surface of the convex portion 320 of the sample stage 110.

With such a configuration, the side wall surface of the convex portion 320 and the upper surface 301 of the concave portion 330 of the sample stage 110 are covered and protected by the susceptor ring 113 with respect to the plasma 109.

Further, in the present embodiment, a conductive ring 114 (a second electrode) is disposed inside the susceptor ring 113

(particularly, a ring-shaped portion disposed on an outer periphery of the upper surface portion 310) made of quartz. The conductive ring 114 is disposed at a position surrounding the convex portion 320 (including the film-shaped electrode 303) on an outer peripheral side of the dielectric film portion 110A (the convex portion 320 of the upper surface portion 310) including the placement surface 300 of the wafer 140 of the sample stage 110. The conductive ring 114 is made of a conductive material such as metal.

The conductive ring 114 is electrically connected with a high frequency power supply 115 (a second high frequency power supply) via a matching device 116 (a second matching device) and a load impedance variable box 117 (a load impedance adjustable circuit) through a power supply cable and the like.

In the plasma processing apparatus 1, during the wafer 140 being processed, high frequency power (second high frequency power) from the high frequency power supply 115 passes through a power supply path including a power supply cable and is supplied to the conductive ring 114. Accordingly, an electric field is formed above the conductive ring 114 based on a potential difference between a potential of the conductive ring 114 and a potential of the plasma 109.

The plasma processing apparatus 1 adjusts supply of the second high frequency power to the conductive ring 114. Accordingly, an electric field intensity or a potential distribution on an outer peripheral side portion from a center portion on an upper surface of the wafer 140 and further above a region covering an upper surface of the susceptor ring 113 is brought close to a desired one suitable for processing. Further, a distribution in a radial direction (the X direction and the Y direction) of the wafer 140 with a processed shape is influenced by a speed of etching processing on the upper surface of the wafer 140 and an incident angle of a charged particle.

Further, in the present embodiment, a predetermined position A1 on a power supply path between the conductive ring 114 and the impedance variable box 117 is connected with earthing 119 (an earthing electrode) which is an electrode on a grounding potential. The earthing 119 and the predetermined position A1 are electrically connected via a resistor 118 (a resistive element) having a predetermined value. Further, the high frequency power supply 115 is electrically connected with the earthing 119. The high frequency power supply 111 is electrically connected with the earthing 119. The base material 110B (the first electrode) is electrically connected with the earthing 119.

[Plasma Processing Apparatus (2)]

FIG. 2 is an illustrative diagram showing an equivalent circuit related to high frequency power in the plasma processing apparatus according to the embodiment in FIG. 1. Particularly, an example of FIG. 2 schematically shows the equivalent circuit along each power supply path for the first high frequency power for forming a bias supplied from the high frequency power supply 111 in FIG. 1 and the second high frequency power for forming a bias supplied from the high frequency power supply 115 to the conductive ring 114.

In this example, a power supply path at one end side of the high frequency power supply 111 (the first high frequency power supply) is electrically connected with a position of a grounding potential. A predetermined first frequency power (the first high frequency power) output from another end side of the high frequency power supply 111 is supplied to the base material 110B which is the first electrode of the sample stage 110 via the matching device 112 (the first matching device) disposed on a power supply path connected to the other end. Further, the power passes through the base material 110B and is supplied to the dielectric film portion 110A that includes the upper surface portion 310 of the base material 110B. The power is transmitted to a resistive component 126 of the plasma 109 through a dielectric film capacity 124 (a capacity C1) showing an electrostatic capacity of the dielectric film portion 110A and a sheath capacity 125 (a capacity C2) showing an electrostatic capacity of a sheath formed above an upper surface of the wafer 140, and flows to a position of a grounding potential.

Similarly, a power supply path at one end side of the high frequency power supply 115 (the second high frequency power supply) is electrically connected with a position of a grounding potential. Second frequency power (second high frequency power) different from output power of the high frequency power supply 111 is output from the other end side of the high frequency power supply 115. The power output from the other end side of the high frequency power supply 115 is supplied via the load impedance adjustable circuit 117 and the matching device 116 (the second matching device) disposed on a power supply path connecting between the other end portion and the conductive ring 114. Apart of the power is transmitted to a resistive component 129 of the plasma 109 through a susceptor ring capacity 127 (C3) showing an electrostatic capacity of the susceptor ring 113 through the conductive ring 114 and a sheath capacity 128 (C4) showing an electrostatic capacity of a sheath formed above an upper surface of the susceptor ring 113. Other parts of the power is consumed by the resistor 118 connected to the above-mentioned position A1, and flows to a position of a grounding potential such as the earthing 119.

On the other hand, the high frequency power supply 111 and the high frequency power supply 115 are electrically coupled through an interior of the sample stage 110 connected to the plasma 109 which is a dielectric or a power supply path for high frequency power such as a power supply cable. Therefore, a part of high frequency power output from at least one of the high frequency power supply 111 and the high frequency power supply 115 flows to a power supply path of another one, which is a so-called leakage phenomenon. A combination of the power supply paths is shown by a resistive component 130 in the plasma 109 and a capacity component 131. The capacity component 131 is a capacity component between power supply paths of a power supply path (a first power supply path) between the matching device 112 and the base material 110B and a power supply path (a second power supply path) between the load impedance adjustable circuit 117 and the conductive ring 114.

In the plasma processing apparatus 1 of the present embodiment, output (the first high frequency power) of the high frequency power supply 111 is relatively higher than an output (the second high frequency power) of the high frequency power supply 115 at a conductive ring 114 side. That is, the second high frequency power is lower than the first high frequency power. An amount of power leaking out from the first power supply path at a high frequency power supply 111 side to the second power supply path at a high frequency power supply 115 side is larger than an amount of power leaking out from the second power supply path at the high frequency power supply 115 side to the first power supply path at the high frequency power supply 111 side.

In a plasma processing apparatus of a comparative example of the present embodiment, the power leaked from the matching device 116 (the second matching device) is detected as reflected power, and operates to match impedance on a power supply path of the high frequency power supply 115 (the second high frequency power supply) in accordance with the reflected power. Therefore, on the contrary, matching on the power supply path becomes unstable. In addition, since load impedance at that time is large, impedance matching is difficult according to an etching condition. Further, the leaked power also generates a voltage on the susceptor ring capacity 127 and the sheath capacity 128. In a case where magnitude of such a voltage cannot be adjusted, etching performance on an outer peripheral side portion of the wafer 140 deviates from a desired one.

In the plasma processing apparatus 1 according to the present embodiment, the predetermined position A1 on the second power supply path between the susceptor ring 113 and the matching device 116 (the second matching device), particularly between the susceptor ring 113 and the load impedance adjustable circuit 117 is electrically connected with the earthing 119. Further, in the second power supply path including a branch, high frequency power from the high frequency power supply 111 (the first high frequency power supply) leaking to the sheath capacity 127 branches and flows from the earthing 119 to a grounding electrode via the resistor 118. Accordingly, load impedance seen from the high frequency power supply 111 is reduced at a resistor 118 side compared to a matching device 116 side, so that an amount of power flowing from the high frequency power supply 111 to the matching device 116 is reduced. Accordingly, the matching device 116 (the second matching device) can perform stable impedance matching. Accordingly, power supplied to the conductive ring 114 can be set independently without consideration of power entrance from the high frequency power supply 111 to the matching device 116.

Further, in the equivalent circuit shown in FIG. 2, the resistor 118 is connected in parallel to a configuration in which the susceptor ring capacity 127 and the sheath capacity 128 which are loads seen from the matching device 116 (the second matching device) on the second power supply path that passes through the susceptor ring 13 from the high frequency power supply 115 (the second high frequency power supply) are connected in series. Accordingly, magnitude of impedance due to a capacity of a configuration connected in series is reduced. Accordingly, the matching device 116 (the second matching device) can efficiently match impedance in accordance with various etching conditions.

Further, impedance of the susceptor ring capacity 127 and the sheath capacity 128 seen from the capacity component 131 is reduced. Accordingly, a voltage drop in the susceptor capacity 127 and the sheath capacity 128 generated by leaked power via the capacity component 131 showing a combination of high frequency power leaking between the above two power supply paths can be reduced. Accordingly, a variation in etching performance on the outer peripheral side portion of the wafer 140 caused by leaked power can be prevented.

As described above, according to the plasma processing apparatus 1 according to the embodiments, inhomogeneity of an electric field in a vicinity of an outer peripheral edge of a sample (the wafer 140) can be prevented, a variation of processing in an in-plane direction of the sample can be reduced, and a yield of processing can be improved in correspondence with various plasma conditions.

Although the invention has been described in detail based on the embodiments, the invention is not limited to the embodiments described above, and various modifications can be made without departing from the scope of the invention. Although an etching device using microwave ECR plasma has been described as an example in the above embodiments, it is also applicable to a dry etching device and the like using other types of plasma (for example, a magnetic field UHF plasma, a capacitive coupling plasma, an inductive coupling plasma, and a surface wave excitation plasma), and the same effects as those described above can also be obtained.

REFERENCE SIGN LIST 1 plasma processing apparatus
101 vacuum container
102 shower plate
103 dielectric window
104 processing chamber
105 vacuum exhaust port
106 electric field generating power supply
107 waveguide
108 solenoid coil
109 plasma
110 sample stage
110A dielectric film portion
110B base material
111 high frequency power supply
112 matching device
113 susceptor ring
114 conductive ring
115 high frequency power supply
116 matching device
117 load impedance adjustable circuit
118 resistor
119 earthing
120 space portion
124 dielectric film capacity
125 sheath capacity
126 resistive component
127 susceptor ring capacity
128 sheath capacity
129 resistive component
130 resistive component
131 capacity component
140 wafer
300 placement surface
301 upper surface
302 side surface
303 electrode
310 upper surface portion
320 convex portion
330 concave portion

The invention claimed is:

1. A plasma processing apparatus that processes a sample placed above an upper surface of a sample stage disposed in a processing chamber in a vacuum container using plasma generated in the sample chamber, the plasma processing apparatus comprising:
  a base material member including a convex portion on which the sample is placed, and having a first electrode disposed there-inside;
  a ring-shaped second electrode disposed in a ring-shaped concave portion to surround the concave portion of the base material member on an outer peripheral side of the upper surface of the sample stage;
  a dielectric ring-shaped member disposed in the concave portion to cover the second electrode and to surround an outer periphery of the concave portion of the base material member;

a plurality of power supply paths that supply high frequency power from a high frequency power supply to the first electrode and the second electrode respectively; and a matching device disposed on a power supply path from the high frequency power supply to the second electrode out of the plurality of power supply paths and an impedance adjustable circuit disposed on the power supply path between the matching device and the second electrode, wherein a first position and a grounding position of the power supply path between the impedance adjustable circuit and the second electrode are electrically connected via only a resistive element, wherein the ring-shaped second electrode is disposed inside the dielectric ring-shaped member.

2. The plasma processing apparatus according to claim 1, wherein base material member has a first diameter of the convex portion and a lower side portion that is below the concave portion having a second diameter larger than the first diameter, and the ring-shaped member includes a first portion that covers the second electrode and is disposed on an outer peripheral side of the convex portion, and a second portion disposed on an outer peripheral side of the lower side portion.

3. The plasma processing apparatus according to claim 1, wherein the high frequency power supply includes a first high frequency power supply that is electrically connected to the first electrode and supplies first high frequency power of a first frequency to the first electrode and a second high frequency power supply that is electrically connected to the second electrode and supplies second high frequency power of a second frequency to the second electrode, the plurality of power supply paths include a first power supply path that supplies the first high frequency power from the first high frequency power supply to the first electrode and a second power supply path that supplies the second high frequency power from the second high frequency power supply to the second electrode, and the resistive element is provided between the first position and the grounding position on the second power supply path.

4. The plasma processing apparatus according to claim 3, wherein the second high frequency power is lower than the first high frequency power.

5. The plasma processing apparatus according to claim 3, wherein said first position is arranged at a predetermined position to provide a branch from the second power supply path to the grounding position of the second power supply path, and said resistive element has a predetermined value selected, to reduce a load impedance as seen from the first high frequency power supply so that said second high frequency power supplied by said second high frequency power supply can be set independently from said first high frequency power supply.

* * * * *